United States Patent [19]

Rice

[11] 4,365,332
[45] Dec. 21, 1982

[54] METHOD AND CIRCUITRY FOR CORRECTING ERRORS IN RECIRCULATING MEMORIES

[75] Inventor: Rex Rice, Menlo Park, Calif.

[73] Assignee: Fairchild Camera and Instrument Corp., Mountain View, Calif.

[21] Appl. No.: 203,774

[22] Filed: Nov. 3, 1980

[51] Int. Cl.³ .................... G06F 11/10; G11C 29/00
[52] U.S. Cl. .................................... 371/13; 371/50; 371/71
[58] Field of Search ................ 371/49, 50, 51, 13, 371/71; 365/200

[56] References Cited

U.S. PATENT DOCUMENTS

| | | | |
|---|---|---|---|
| 3,768,071 | 10/1973 | Knauft et al. | 371/71 |
| 3,940,601 | 2/1976 | Henry et al. | 371/71 |
| 4,037,091 | 7/1977 | Beuscher | 371/13 |
| 4,175,692 | 11/1979 | Watanabe | 371/13 |
| 4,216,541 | 8/1980 | Clover et al. | 371/13 |
| 4,296,494 | 10/1981 | Ishikawa et al. | 371/13 |

Primary Examiner—Charles E. Atkinson
Attorney, Agent, or Firm—Ken Olsen; T. S. Park; W. M. Becker

[57] ABSTRACT

A method and circuitry are disclosed for correcting bit errors introduced by random events in a data recirculating memory, such as a charge coupled memory device or a bubble memory. The bit errors, caused by random events such as by alpha particle bombardment or other causes, are corrected in circuitry that generates row and column parity bits corresponding to various segments of the information stored in the memory. Changes in the row and column parity bits uniquely define the location of failed bits circulating through the memory even though each failed bit has no fixed address, so that error detection circuitry thereafter may correct the error during the next or a subsequent bit recirculating cycle. The invention facilitates the use of very large memories, for example, on the order of one billion bits or more.

16 Claims, 16 Drawing Figures

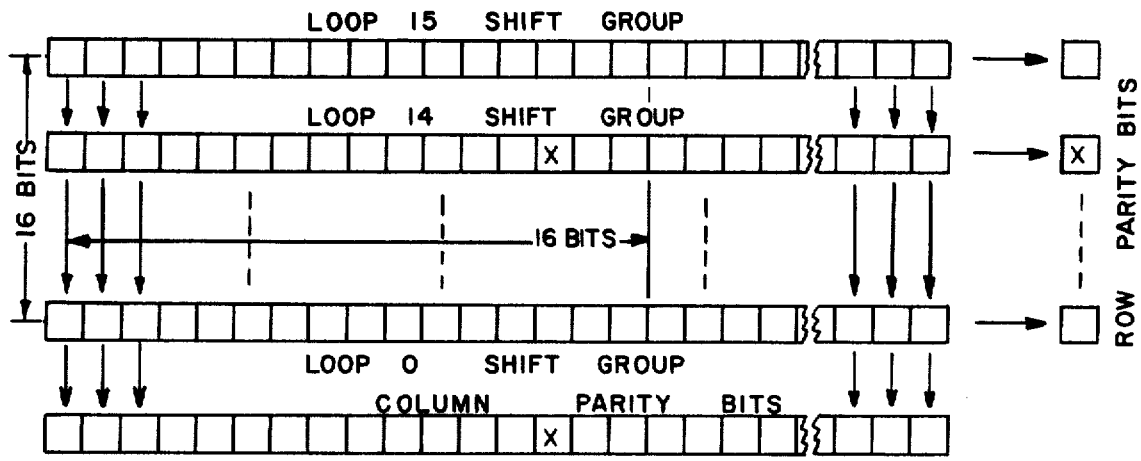
FIG. 5
FIG. 6
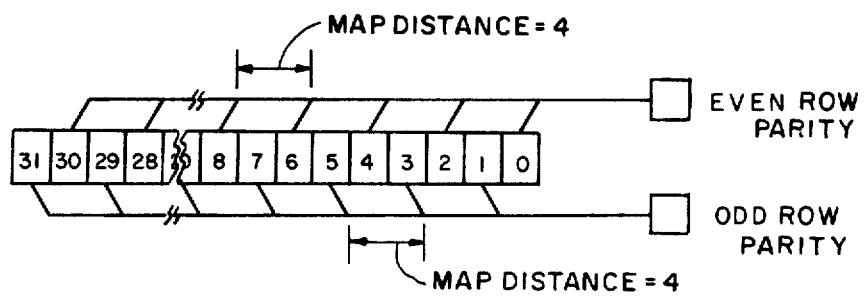
FIG. 7

CORRECTION TIMING

DATA LOOP SELECTION

WRITE ROW PARITY

EXAMPLE OF MEANS TO OBTAIN MAP DISTANCE ON COLUMN PARITY.

EXAMPLE MEMORY COMPONENT WITH LOOP TYPE (i.e. SHIFTING) DATA STORAGE.

METHOD AND CIRCUITRY FOR CORRECTING ERRORS IN RECIRCULATING MEMORIES

FIELD OF THE INVENTION

This invention relates to a method and circuitry for correcting errors in memory components which errors may be induced by random events at random times. Specifically, the invention may be utilized in conjunction with charge-coupled device (CCD) memories to correct errors in the circulating bits as they occur, and therefore to permit the fabrication of very large CCD memory systems which would otherwise not be feasible. These techniques apply to all types of recirculating loop memory including bubble memories.

DESCRIPTION OF THE PRIOR ART

With the advent of recirculating loop memory components, such as charge-coupled devices, the problem of "soft" failures has become apparent and has caused reliability problems at a system level for users of systems utilizing these components. As used herein, the term "soft failure" is defined as a failure in which a random event causes a memory bit to change state. Soft failures appear to be random in nature, rather than a function of memory design, mask tolerances, or processing technology. While the causes of such failures may be unknown, it is believed that they typically occur when a random burst of energy, such as a cosmic ray, strikes a particular bit within a memory. They may also be caused by other phenomenon such as a momentary change in power supply voltages, currents or magnetic fields. Under normal operating conditions, the memory will continue to function properly if the failed bit is corrected and rewritten.

One well known technique used in large memory systems to correct memory "words" for soft and hard failures is to use Hamming single error correction, double error detection codes. In smaller memories with low hard and soft bit failure rates, this solution is adequate. In larger systems, however, the number of memory components can be large enough that even moderate soft failure rates may cause an uncorrectable double bit error, and thereby reduce the mean time to failure of the system to an unacceptably short period.

Tests have been performed on a half million byte memory using CCD components in which a soft failure rate of one failure per hundred device hours was detected. The number of bits affected by the observed soft failure events varied from one to as many as 20, with the average being between two and three. In prior art error detection and correction systems where each bit of an error correction group (or machine word) is stored in a different memory component, the well known Hamming single error detection system can accommodate these multiple failures in one component because each failed bit will be in a different word. The Hamming error correcting bits are stored with data bits in the word to be corrected. To correct an error the word must be read out from memory to logic circuitry, checked, corrected if necessary, and, if corrected, rewritten into original location. In very large memories the amount of time required to read and check every word in a specified time period can use a very appreciable percentage of memory operating time and thus degrade memory performance. There is also a small probability that errors will overlap in the same error correction word and thereby be uncorrectable. Obviously this probability increases as the size of the memory system increases and also as the failure rates go up. For very large systems, for example, on the order of one billion bits of CCD memory, the calculated mean time to a failure due to double soft failures in a single error correction group may be on the order of ten hours. Failure rates of this magnitude are unacceptably high to system users, and would therefore preclude use of such large memories absent a system for correcting the soft bit failures as they occurred.

The particular problems associated with correcting soft failures in recirculating dynamic memories, and with the drawbacks of certain prior art approaches to correcting these errors, may be better understood by an example. For example, the Fairchild Camera and Instrument Corporation product F464 65K-bit CCD memory has 16 loops, each of which contains 4,096 bits, and all loops circulate continuously. Each loop of 4,096 bits is interrupted at one point with a sense amplifier and an input-output circuit so that bits circulating in the loop are amplified and then re-entered into the loop continuously. The circulation rate may be such that all of the 4,096 bits per loop pass through the loop sense amplifier in approximately one millisecond. Thus in a single CCD component as described 16 such loops will continuously circulate. In very large memory systems, thousands of CCD components each with 16 loops or registers will be continuously circulating. For a one billion bit memory approximately one quarter million registers will be continuously circulating. Even assuming very low failure rates approximately five thousand bits may have soft failures somewhere within the system every hour. If these failures accumulate at the rate of five thousand per hour a double bit failure in a single error correction group (i.e., word) will occur in an unacceptably short time. In normal use of memory systems, however, data from a given loop may be read from several to many times and only occasionally rewritten. Using Hamming error correction codes the soft failures occurring in those portions which are relatively frequently rewritten will be removed. Thus, in the normal course of utilizing the computing system, some portions of the very large memory storage will be read and sometimes rewritten with either new data or corrected data, while other portions will seldom be rewritten. Since some portions may remain for as long as several weeks without being rewritten, it is impossible to assure that with normal system usage all areas of the memory will be rewritten with sufficient frequency to remove the accumulated soft bit failures.

One potential technique for removing the soft bit failures is to interrupt normal system processing and perform periodic rewriting of all error correction groups in the memory system utilizing Hamming error detection and correction. This rewriting could be accomplished in a single complete rewrite of the entire memory, or could be integrated into the system operating program to periodically interrupt computing and rewriting selected portions of the memory at any one time. Either approach, however, slows down the computing operation of the system, and in very large systems, may consume an appreciable portion of total computing time.

SUMMARY OF THE INVENTION

Accordingly, it is an object of this invention to provide a solution to the problem of soft failures in recirculating memories which does not interrupt overall system operations.

It is a further object of this invention to provide a correction mechanism which is capable of correcting soft bit failures in each memory component soon after the failures occur.

It is a further object of this invention to enable such a system to be designed using the same type of circuits and the same type of component fabrication processing as the remainder of the memory component, and not to require faster circuit operation than the memory component.

It is a further object of the invention to provide an error correction system which is integral to the memory component itself, that is, where the error correcting circuitry is manufactured integral with the other circuitry with the same processes on the same materials. In integrated circuit applications and in bubble memory applications it is also an object of the invention that it occupy only a small area of the integrated circuit.

Briefly described, the invention includes circuitry that continuously samples all data circulating in each data loop, generates row and column parity bits and stores them in row and column parity recirculating memories. Whenever an error occurs in a data loop, the generated row and column parity bits will disagree with the previously stored parity bits representing that particular data loop and position. If the bit difference is not due to new data entering the loop, error detection circuitry will signal a correction generator that will change the incorrect bit and insert it at the proper location within the next one or a few circulating data cycles of that particular data loop. Using the same technique an error in the row or column parity bits may be detected and corrected.

The bit correction system of the invention may be used with most very large recirculating loop memory systems but will be explained herein in connection with the aforementioned Fairchild Type F464 CCD Dynamic Serial Memory which includes sixteen dynamic shift registers each arranged in a serial-parallel-serial (SPS) architecture. In each of the sixteen shift register blocks of this memory, a total of thirty-two data bits are sequentially shifted into a serial input register which, when full, transfers the entire thirty-two-bit "word" into thirty-two parallel registers of sixty-three bits in length. Two sets of sixty-three bit parallel registers are provided. At the output end of this parallel structure, bits are loaded in parallel into a thirty-two bit serial output register and are shifted out to the sense amplifier and recirculated automatically back into the serial input register unless a "write" operation is specified.

The circuitry of the invention computes column parity of all corresponding columns of the sixteen data loops so that, when a bit error is detected, its column can be determined. Row parity is calculated on sixteen-bit groups of bits from each of the sixteen data loops so that if an error is detected, it can be accurately located within a sixteen-bit group of a particular data loop. The circuitry may therefore combine the column and row information to accurately pinpoint the precise location of an erroneous data bit, and a correction generator rewrites the correct bit at the appropriate position in the next or a subsequent cycle of that particular loop.

DESCRIPTION OF THE DRAWINGS

In the drawings which illustrate a preferred embodiment of the invention;

FIG. 5 is a diagram illustrating the map distance locations of failed bits in a thirty-two bit shift group of FIG. 3;

FIG. 6 is a schematic diagram illustrating the generation and storage of row and column parity bits;

FIG. 7 is a schematic diagram illustrating the storage of odd and even row bits in a thirty-two bit shift group;

DESCRIPTION OF THE PREFERRED EMBODIMENT

Figure 1:
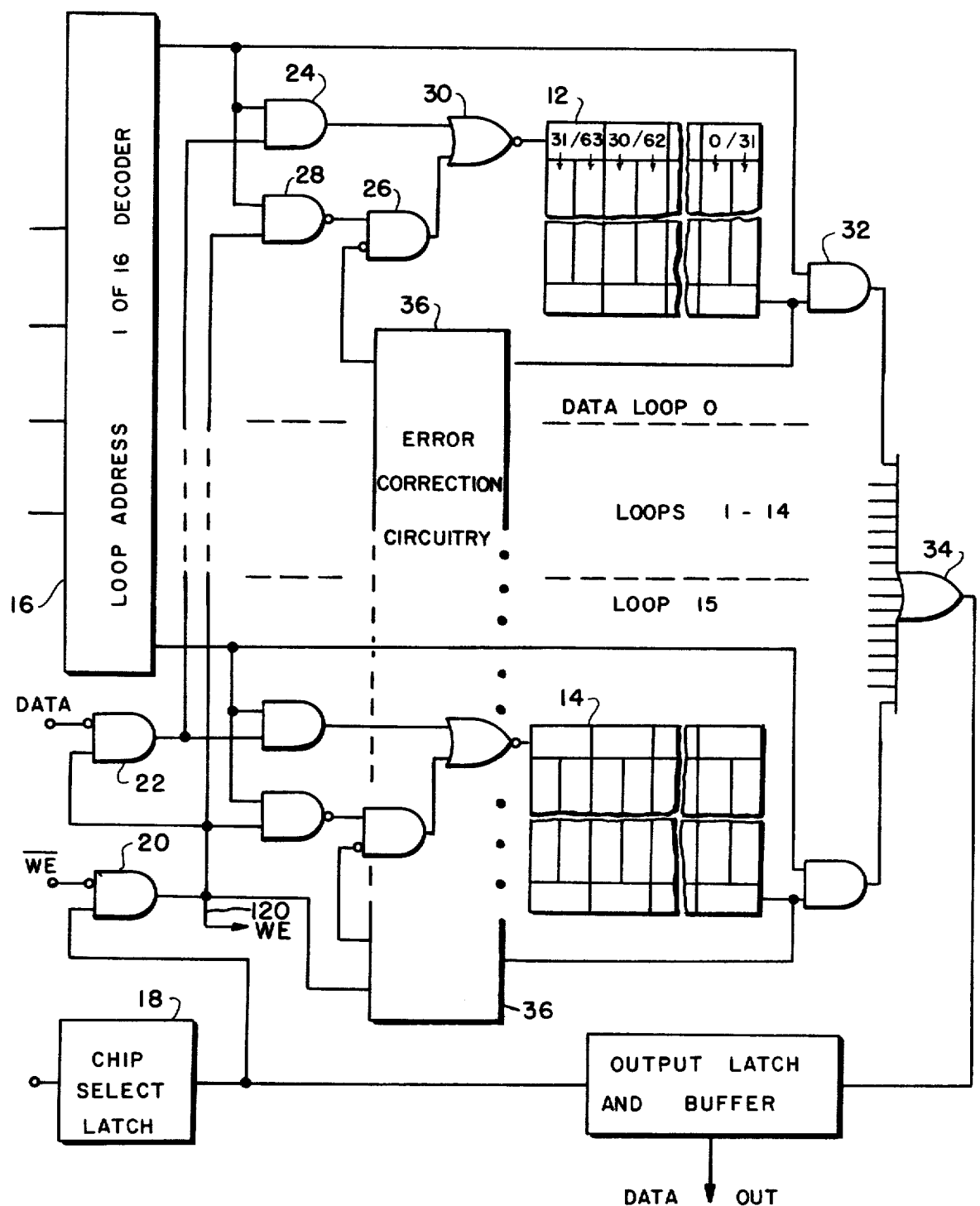
FIG. 1 is a block diagram of a serial-parallel-serial organized dynamic memory incorporating the error correction circuitry of the invention.

FIG. 1 is a block diagram illustrating a typical serial-parallel-serial organized dynamic memory incorporating the correction circuitry of the invention. While the invention may be used with any recirculating memory system, it will be described in connection with the commercially available Type F464 Dynamic Serial Memory manufactured by Fairchild Camera and Instrument Corporation. The memory illustrated in FIG. 1 includes sixteen data loops, each having a CCD shift register such as the register 12 with a capacity of 4,096 bits. Except during a write to memory operation the 4,096 bits circulate continuously through input gate 30, the serial-parallel-serial architecture register 12, the output gate 32 and back to input gate 30. Each of the registers, such as the registers 12 or 14, employs an interlaced serial-parallel-serial (SPS) architecture having a thirty-two bit serial input register which, when full, shifts the entire word into parallel registers sixty-three bits in length. The output of the parallel registers are then clocked into a serial output register. In the actual interlaced structure, each bit of the input serial register services two parallel registers rather than just one so that after each shift group of thirty-two bits is clocked into the input register at a clock rate of perhaps five megahertz, a transfer clock will transfer the data from the serial register into one of two sets of thirty-two parallel registers. Sixty-three clock cycles later these data are again transferred into the serial output register. The operation of the serial-parallel-serial system is transparent at the output gate 32 where a single serial stream of 4,096 bits is available.

In a write to memory operation, one of the sixteen data loops is selected by an appropriate input signal to a loop address decoder 16. The CS input to a chip-select latch 18 is high to condition it so that a write-enable (WE) at AND-gate 20 will produce a high output to enable a data input through AND-gate 22. Data passing through the gate 22 is then combined with the appropriate loop address from the decoder 16 through an AND-gate 24 and is then passed into the input serial register of the selected loop 12. The recirculation of the loop is thus broken and new data is stored during the write time.

After data is entered, the system is placed in a standby mode by a low CS input thereby disabling and disregarding any inputs at the write-enable gate 20, the data input gate 22, and the address input gate 24. Data in the SPS registers goes through a sense amplifier, not shown, and is then clocked from the output through AND-gate 26 which is now enabled by either the absence of a loop address signal or write-enable signal through NAND-gate 28, and through the input NOR-gate 30 to the serial input register of register 12. Thus, data contained within the SPS register 12 are continually circulating from output through AND-gate 26 and NOR-gate 30 back into the serial input register at the clock frequency of the system. All sixteen of the data loops operate in the identical manner and each will produce an output signal through its respective output AND-gate 32 into a system output OR-gate 34, upon being enabled by the loop address decoder 16.

Interposed in each of the sixteen data loops of FIG. 1 is the error correction circuitry 36 to be described in detail hereinafter.

Figure 2:
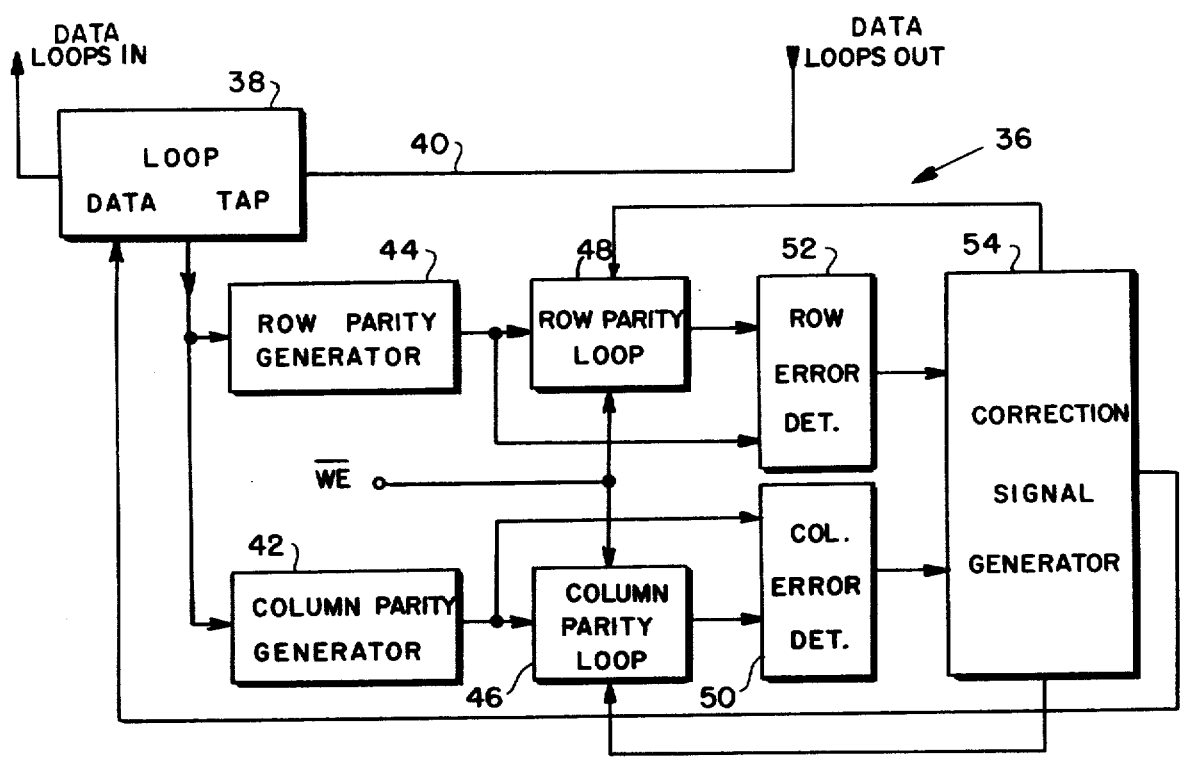
FIG. 2 is a block diagram of the error correction circuitry of FIG. 1.

FIG. 2 is a block diagram of the error correction circuitry of FIG. 1. Interposed in each of the sixteen data loops between the serial output register and serial input register is a loop data tap 38 through which the recirculating loop data passes and which serves to correct erroneous data bits as will be subsequently described. The loop data tap 38 samples all of the data bits circulating through its respective data loop via output conductor 40 and transmits them to a column parity generator 42 and a row parity generator 44. As will subsequently be described, the column parity generator 42 computes the parity for each column of circulating bits from all sixteen loops and stores the generated 4096 parity bits in the column parity loop 46. As will be subsequently described, the row parity generator 44 computes the row parity for a specified number of bits in each of sixteen loops thus providing 16 row parity bits to be stored in the row parity loop 48. When the specified number is chosen as 16 then the number of row parity bits stored in row parity loop 48 will equal 4096. Column and row parity bits are stored in the parity loops which may be identical in structure to the loops storing data. It can be easily calculated, therefore, that separate 4096-bit column and row memory loops are required for the storage of computed parity bits from the above described system. Thus, for this example case a complete system having sixteen data loops and including the present error correction system will actually require a total of eighteen loops. In other applications a larger number of column bits and a larger number of bits in each respective row loop may be combined to form the column and row parity bits thus still requiring only two extra parity bit loops for row and column parity for a larger amount of memory. The architecture of the column and row parity loops may be the same as the data loops if so desired.

The column parity loop 46 is coupled to a column error detector 50 which compares in synchronization the output of the stored parity bit in the parity loop 46 with the next incoming parity bit generated by the column parity generator 42. Similarly, the row parity loop 48 generates an output which is compared in synchronization in the row error detector 52 with the next generated row parity bit. If the memory is in its read or recirculate modes, all recirculating data bits will remain unchanged unless some random event causes a bit change and therefore an error. If such a bit error occurs, the row error detector 52 and column error detector 50, both of which compare the latest stored parity bits with the latest generator parity bits, will note the error and will signal a correction signal generator 54. Generator 54 will thereupon generate a changed bit signal output to the loop data tap 38 at the precise time the faulty bit next recirculates through the tap 38. Errors in the data as well as errors in the row and column parity loops may be detected by the row error detector 52 and the column error detector 50. If both a row and a column parity error is indicated the error is in the addressed data bit location. If a row parity error only is indicated the error is in the row parity loop and the row parity bits should be recalculated and stored in the row parity loop. If a column parity error only is indicated the error is in the column parity loop and the column parity bit(s) should be recalculated and stored in the column parity loop. The correction signal generator 54 can control the parity bit corrections. The row parity may be corrected by allowing the row parity generator 44 output to be entered into the row parity loop 48 at the parity error location, or if desired any appropriate portion up to the full loop may be recalculated and stored, with other error correction made inactive during the correcting cycle. The column parity may be corrected by allowing the column parity generator 42 output to be entered into the column parity loop 46 at the parity error location, or if desired any appropriate portion up to the full loop may be recalculated and stored, with other error correction made temporarily inactive. By the process of correcting all data and parity bit errors very soon after they occur a build up of error bits in an error correcting group becomes statistically a very remote probability.

Figure 3:
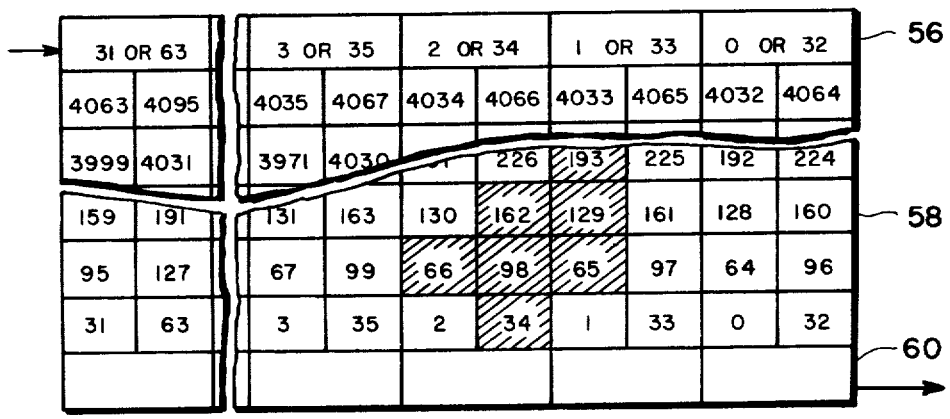
FIG. 3 is a schematic diagram illustrating a portion of the memory storage locations in an SPS dynamic memory.

FIG. 3 is a pictorial representation of a typical CCD memory register, such as the register 12 of FIG. 1. FIG. 3 illustrates interlaced data to be transferred from the input serial register 56 into the parallel registers 58 of the device. Note that the first thirty-two input bits are shifted into register 56 and are then transferred into thirty-two parallel registers 58. A second group of thirty-two bits is then shifted into the input serial register 56 and then transferred into an alternate group of thirty-two parallel registers. As the data is clocked down through the parallel registers 58 from the input 56 to the output register 60, the relative location of the bits to one another remains the same.

Unlike a random access memory, however, there are no fixed storage positions directly related to any single data bit recirculating in the loop. Logic external to the loop must keep track of an arbitrary "zero" index bit location. The CCD memory is illustrated in FIG. 3 at the instant when the first sixty-four data bits are in the lowest position of the parallel registers 58 and just prior to the occurrence of a first transfer signal that will place the bits 0 through 31 into the output register 60 to be followed thirty-two clock cycles later by a second transfer signal that will place bits 32 through 63 into the serial output register 60. After all sixty-four bits have been shifted out of the memory, the parallel shift registers will then shift down and the process will repeat itself.

Illustrated by cross-hatching in FIG. 3 is a group of seven bits assumed to have suffered a soft failure because of some random event, for example, the bombardment of an alpha particle. Such a seven-bit "hit" is an extremely rare occurrence and it has been determined that the average number of bits affected by such a soft failure is normally between two and three. It is quite apparent that if such failures are not corrected, the errors will continue to circulate through the memory and thereby render it ineffective as other soft errors accumulate.

Figure 4:
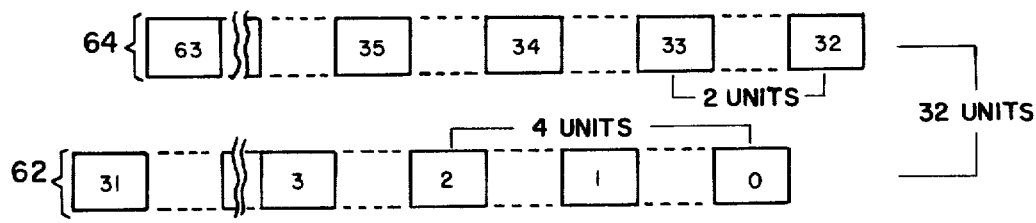
FIG. 4 is a schematic diagram illustrating map distance spacing of bits in the readout of the memory of FIG. 3.

FIG. 4 is a schematic diagram presented to illustrate bit spacing or "map distance" between bit positions just prior to transfer to the serial output register 60 of FIG. 3. The diagram of FIG. 4 is aligned with that of FIG. 3 and contains a first group 62 containing the bits 0 through 31 and a second group 64 containing the bits 32 through 63. It will be noted that in any group, such as the groups 62 and 64, adjacent consecutively numbered bits are spaced apart. For example, the space between bits 32 and 33 is two units. Since the register will shift all of the first thirty-two bits out before transferring and shifting the second group of thirty-two bits, the map distance or spacing between bit 0 and bit 32 is thirty-two units. This concept of "map distance" as related to a soft failure pattern is used as a basis for the correction algorithm and the development of the correction circuitry when adjacent bits may be affected by a soft failure.

FIG. 5 is a schematic diagram of ten consecutive output register shift groups and illustrates the map bit pattern of the seven-bit failure illustrated in FIG. 3. In this particular example, bits 34, 65, 98, 66, 129, 162, and 193 are affected as indicated by the cross-hatched section of FIG. 3. The soft failures mapped in FIG. 5 are represented by small crosses and show two adjacent failures occurring in the output register shift group 64–95. These two adjacent failures, bits 65 and 66, are spaced by a map distance of two units, as explained in connection with FIG. 4. As will be subsequently explained in reference to FIG. 7, row parity is separately generated for both odd and even data bits, simultaneously, so that any two consecutive bits in any thirty-two bit shift group can be identified. Therefore, the correction circuitry of the invention is designed to accommodate as many as four soft failures in any parallel register row shift group such as the row group containing the bits 65, 98, and 66 of FIG. 3. Based upon experimental observations, four such extensive soft failures are extremely unlikely in one parallel register shift group and would, for example, affect bits 65, 98, 66 and 99, in addition to two or three more failed bits in each of the closely neighboring shift groups of FIG. 3.

FIG. 6 is a schematic diagram illustrating the generation of row and column parity bits and the means by which an error location is addressed. As previously mentioned, column parity bits are generated from the combination of corresponding bits in each of the data loops in the memory system. Thus, in a system employing sixteen loops of 4096 bits per loop, column parity will be computed by combining all data bits from the serial output register of all sixteen loops. In such a 4096 bit loop system, there will therefore be 4096 column parity bits which must be stored. If a random error is detected in one of the shift groups, such as the error indicated by the cross in loop 14 of FIG. 6, the correction system will accurately detect the column containing the failure. However, since corresponding bit locations in each of the sixteen loops are combined, column parity cannot alone determine which of the sixteen loops have been hit. The row parity bit can identify a particular loop and a section thereof. As illustrated in FIG. 6, parity generation calculates the row parity code for each sixteen bit group emanating from the serial output register of each loop. Thus, each loop of 4096 bits will produce 256 row parity bits and the entire memory component of sixteen loops will generate 4096 row parity bits. Thus, the storage of the row parity bits and column parity bits each require an additional data loop of 4096 bits.

FIG. 7 is a schematic diagram illustrating the calculation of row parity bits to provide for a map distance of four as previously discussed in connection with FIG. 5. As discussed in connection with FIG. 6, it was noted that row parity was calculated by combining each sixteen bit group from each data loop. FIG. 7 illustrates that each thirty-two bit shift group such as the shift group 0–31 of FIG. 5, is broken down into sixteen "even" and sixteen "odd" row parity bits. By thus computing the parity of all the even bits and separately computing the parity of all the odd bits, the thirty-two bit group divides into two sixteen-bit groups, each with its own parity check bit. As shown in FIG. 4, the bits 0, 2, 4, 6, etc., have a minimum map distance spacing from each other of four units. The use of the odd and even row parity check bits provides a map distance of four units between adjacent even and adjacent odd bits. Thus, for each thirty-two bits shift group, two row parity bits may be stored interleaved in the row parity loop so that only one odd and one even row parity bit may be supplied for each thirty-two-bit shift group.

Having thus described the problem of random bit failures and the basic method of their detection and correction, a description of the error correction circuitry follows.

Very briefly returning to FIG. 2, data circulating through each of the sixteen data loops is sampled and parity is generated by column parity generator 42 and row parity generator 44. When data is written into the memory the generator parity bits are stored in the respective parity loops 46 and 48 and on subsequent recirculations the output of the parity loops are compared with the next incoming parity bits by the error detectors 50 and 52. If the most recent generated parity bit from the recirculating data bits disagrees with the stored parity bit, the error detector signals a correction signal generator 54 which signals the appropriate data tap 38 to correct the failed bits during the next or a subsequent recirculation of the loop. If the error is in the row or column parity bits the correction signal generator 54 signals a correction in the row parity loop storage 48 or in the column parity loop storage 46.

Figure 8:
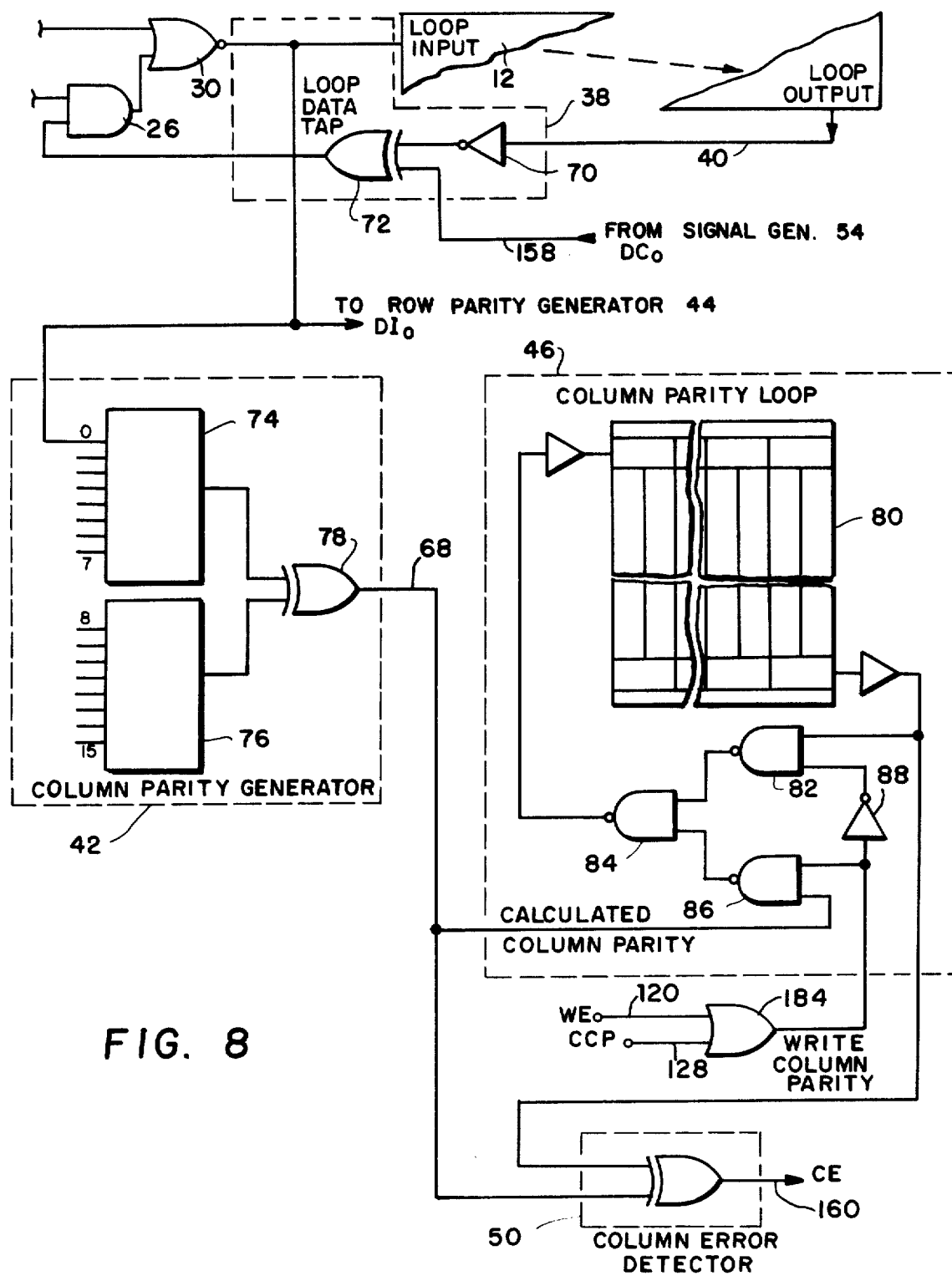
FIG. 8 is a circuit block diagram of the loop data tap circuitry, column parity generator, column parity bit loop, and column error detector of FIG. 2.

FIG. 8 includes circuit block diagrams of the data loop tap 38, the column parity generator 42, the column parity loop 46, and the column error detector 50. As data is transmitted from the output conductor 40 of each of the sixteen CCD memory loops, it passes through one of sixteen loop data taps 38, such as the tap 38 of FIG. 8. The data is passed through an inverter 70, one terminal of an exclusive OR-gate 72 and thence back to the input terminal of the serial input register through gates 26 and 30 in its respective CCD memory register. The second input to the exclusive OR-gate 72 is a change bit instruction from the correction signal generator 54 of FIG. 2 and to be subsequently described in connection with FIG. 2. Thus, the circulating data from the loop is free to pass through the gate 72 unless corrected by the signal from the signal generator. The correction is made by inverting the state of a bit.

Data from each of the sixteen data loop taps, such as tap 38, is taken at the output terminal of the input gate 30 and is directed both to one of the sixteen input terminals of the row parity generator 44 and to the appropriate one of sixteen input terminals of the column parity generator 42. The column parity generator 42 may comprise circuitry on the memory component or may be, for example, a commercially available parity generator/checkers 74 and 76, such as the type LS-280, 9348, or equivalent, and the output of each of the parity generators 74 and 76 is applied to an exclusive OR-gate 78.

On data input to the memory or on a parity bit correction cycle, the generated parity bit output of the column parity generator 42 is stored in the column parity loop 46. Loop 46 includes a 4096-bit SPS-organized memory 80 similar to each of the sixteen CCD data memory loops described in connection with FIG. 1 and circulates parity signals from the serial output register through NAND-gates 82 and 84 into the serial input register unless, however, the data loops of FIG. 1 are being reloaded with new data by the application of a write-enable signal or when column parity is being corrected. The generated parity bit signal from the column parity generator 42 is applied via conductor 68 to one input terminal of a NAND-gate 86, the other input terminal of which is connected to be disabled by the write column parity input signal which is activated during the data writing mode signal on the write enable conductor 120 or during a column parity correction mode signal on conductor 128 and developed in the circuitry of FIG. 10. In the absence of such writing mode, parity bit signals pass through the NAND-gates 82 and 84 to recirculate through the register 80. The column parity register 80 may be identical in structure to the data registers 12.

The output of the column parity loop 46 which stores column parity bits for each of the 4096 columns in the data memory is taken from the coupled output of the serial output register of the memory 80 and is connected to the column error detector 50. Column error detector 50 simply comprises an exclusive OR-gate, one terminal of which is connected to the output of the column parity loop 46, the second input terminal of which is connected to the output of the column parity generator 42. As long as the stored signal from the column parity loop 46 agrees with the parity bits generated by the parity generator 42, there will be no output of the error detector 50. However, if one or more of the bits stored in one of the data loops of FIG. 1 fail, an output signal of the column parity generator 42 will be produced and a corresponding output will be developed on output conductor 160 of the column error detector 50.

Figure 9:
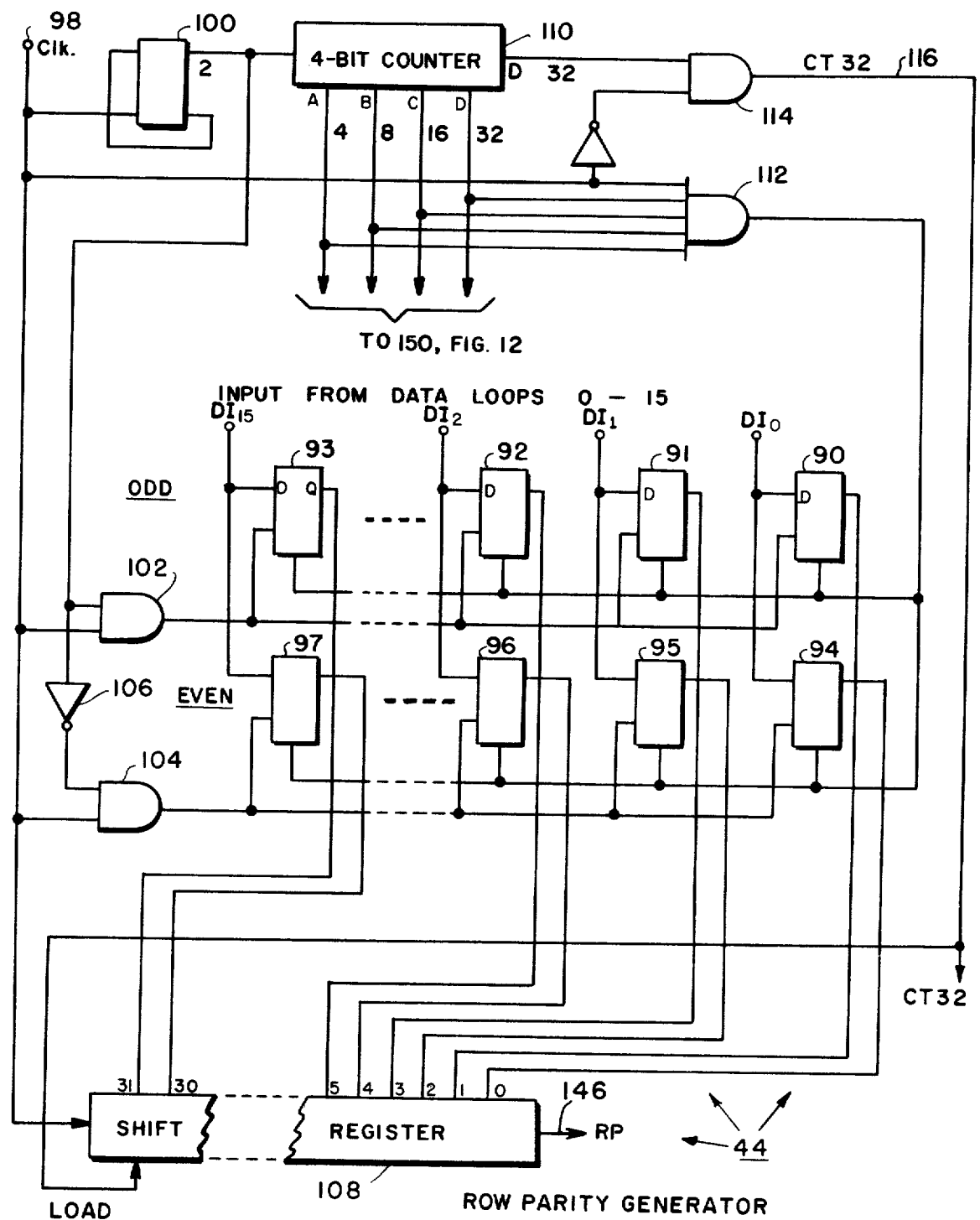
FIG. 9 is a circuit block diagram of the row parity generator of FIG. 2.

FIG. 9 is a schematic block diagram of the row parity generator 44 of FIG. 2 and the circuitry includes a first group of sixteen D-type flip-flops 90–93 and a second group of sixteen D-type flip-flops 94–97. Each of the flip-flops 90–93 and 94–97 are clocked during alternate cycles of the system clock. The clock signal received at input terminal 98 is applied to a D-type flip-flop 100, the true output of which is one-half the clock frequency. This signal is combined with the clock signal to obtain the proper clock frequency and phasing for the two groups of flip-flops, the first group of sixteen flip-flops 90–93 are clocked through AND-gate 102 and the second group of flip-flops 94–97 are clocked through AND-gate 104. The true output of flip-flop 100 which is applied as one input to AND-gate 102 is inverted at inverter 106 before entering AND-gate 104 so that flip-flops 94–97 are enabled only during the period that flip-flops 90–93 are disabled or, in other words, each flip-flop group is clocked on alternate clock cycles. As discussed in connection with FIG. 7 row parity is calculated for both odd and even numbered bits to provide for the detection of two consecutively numbered bits in each thirty-two bit output shift group. Therefore in FIG. 9, the flip-flops 90–93 sample the odd bits while flip-flops 94–97 sample the even bits circulating through the sixteen data loops of FIG. 1. This sampling is accomplished by coupling the loop data tap 38 of data loop 0 to both of the inputs of the odd and even flip-flops 90 and 94, respectively, inputs from data tap of loop 1 to the inputs of flip-flops 91 and 95, respectively, etc. The two outputs of each of the sixteen odd flip-flops 90–93 and the sixteen even flip-flops 94–97 are applied to a thirty-two bit parallel input serial output shift register 108, the output of which is coupled via conductor 146 to the row parity loop to be subsequently described.

The row parity generator of FIG. 9 includes the necessary generators for properly clearing the parity flip-flops 90–97 and for shifting the bit in the shift register 108. Thus, the output of the timing flip-flop 100 is applied to the input of a four-bit counter 110 which further divides the clock frequency by 4, 8, 16 and 32, designated A, B, C and D, respectively. The four outputs of the counter 110 are combined with the clock frequency in a multiple input AND-gate 112 which produces its output pulse once every thirty-two clock cycles to reset the parity flip-flops 90–97. The shift register 108 may be loaded by the ripple carry output of the four-bit counter 110 which, when combined in the AND-gate 114 with an inverted clock signal, will produce a properly phased pulse for shifting the load from flip-flops 90–97 to the shift register 108. In this logic each flip-flop 90–97 will sample sixteen bits of data to generate a parity bit. When thirty-two bits have been sampled from each of sixteen data registers the flip-flop states are transferred to the shift register 108 and the flip-flops are reset to start the next sequence. The shift register 108 is clocked for output so a continuous stream of bits is available. Since thirty-two bits are accumulated before transfer and then the thirty-two bits are shifted out in series, the location of a row parity bit in its loop may be between 33 and 65 shift locations later than a column parity for the respective group. This difference will not affect the correction of data bits, the correction of column parity bits or the correction of row parity bits since as will be explained later, these bits are corrected one loop cycle of 4096 clock times after they are detected. However, upon data input to the memory during "write enable" provisions must be made to properly offset the storage of row parity bits.

Figure 10:
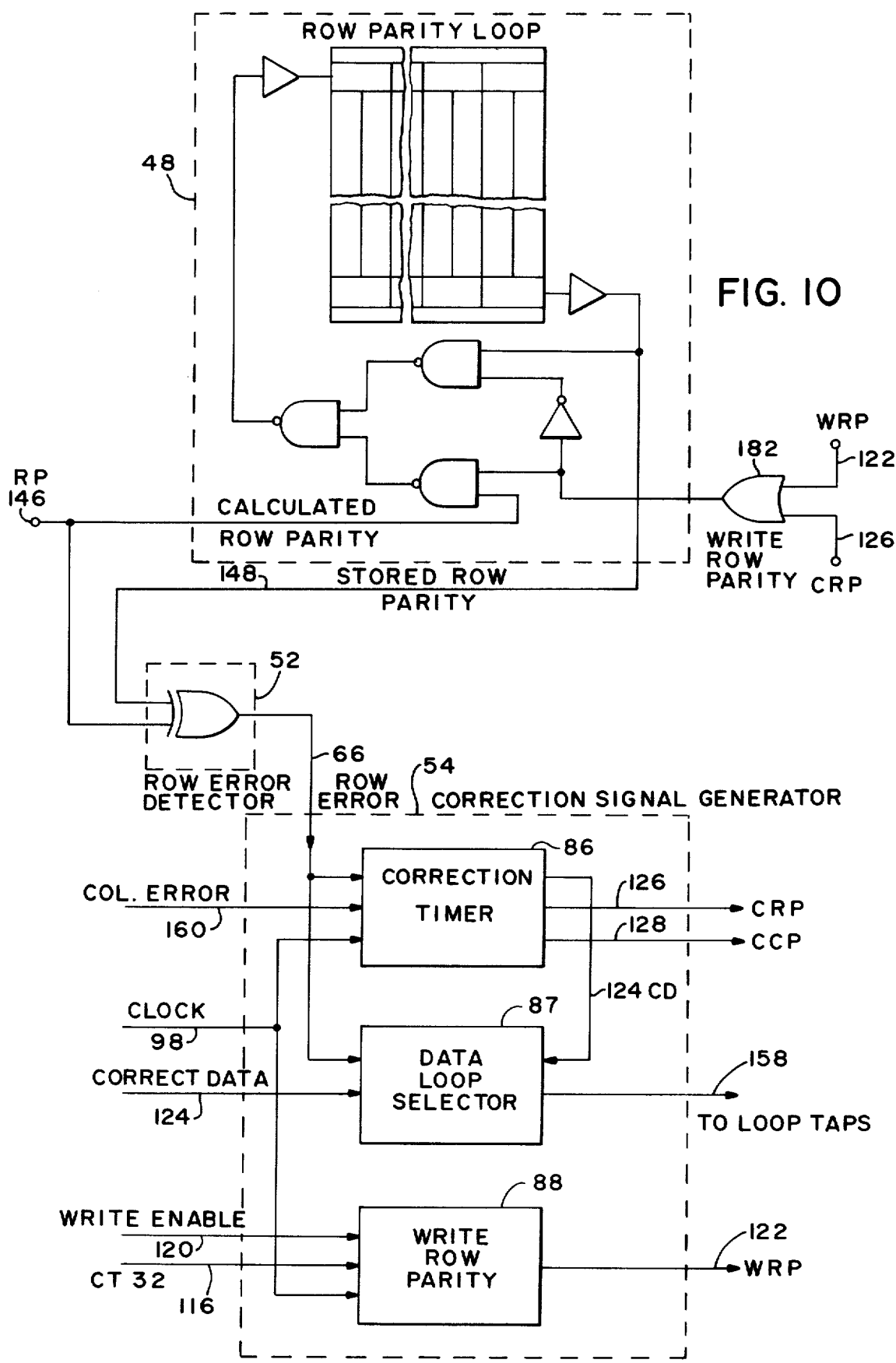
FIG. 10 is a circuit block diagram of the row parity storage loop, row error detector, and loop selection which is a part of the correction signal generator of FIG. 2.

FIG. 10 is a circuit block diagram of the row parity loop 48, row error detector 52 and a block diagram of correction signal generator 54 of FIG. 2. The generated row parity bits from the serial output shift register 108 of FIG. 9 enter FIG. 10 at input terminal 146 and are stored in the row parity loop 48 which is similar in all respects to the column parity loop 46 of FIG. 8. The circulating row parity bits in the loop 48 output via conductor 148 to one input of the row error detector 52, the second input of which is received directly from the input terminal 146. The row error detector 52 is comprised of an exclusive OR-gate that produces an output signal only if a stored row parity bit on the conductor 148 differs from the next generated parity bit at terminal 146.

The primary function of the correction signal generator 54 is to identify the precise location of failed or incorrect data bits circulating through the sixteen data loops of 4096 bits per loop. Therefore, in addition to the system clock signal 98, correction signal generator 54 receives inputs of write-enable 120 from gate 20 of FIG. 1, from the row error detector 52 via conductor 66, from the column error detector 50 of FIG. 8 via conductor 160, and from the four-bit counter 110 of FIG. 9 via conductor 116. Each one of the sixteen output terminals 158 of the generator 54 is coupled to a corresponding one of the sixteen loop data taps, such as the data tap 38 of FIG. 2.

The correction signal generator 54 of FIG. 10 is comprised of three major components: the correction timer 86, the data loop selector 87 and write row parity 88. The external inputs to these circuits are row error on conductor 66, column error or conductor 160, write enable on conductor 120, the shift signal for register 108 on conductor 116 and the clock signal from the input terminal 98. The outputs are correct row parity on conductor 126, correct column parity on conductor 128, sixteen loop selection lines on conductor 158 and write row parity on conductor 122.

Figure 11:
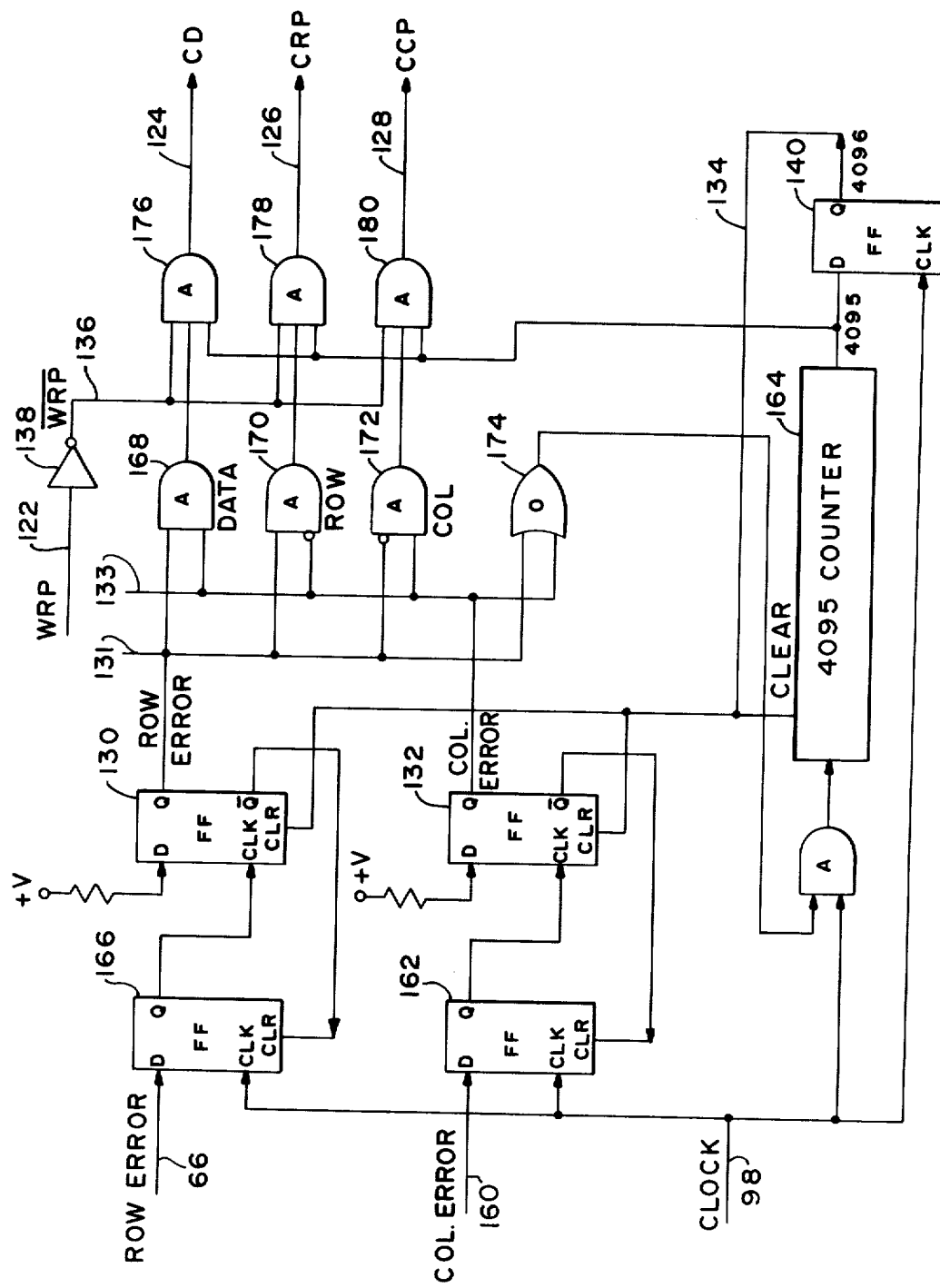
FIG. 11 is a block diagram of the circuit to receive the row and column error signals and to generate correction signals for data, row parity and column parity.
Figure 12:
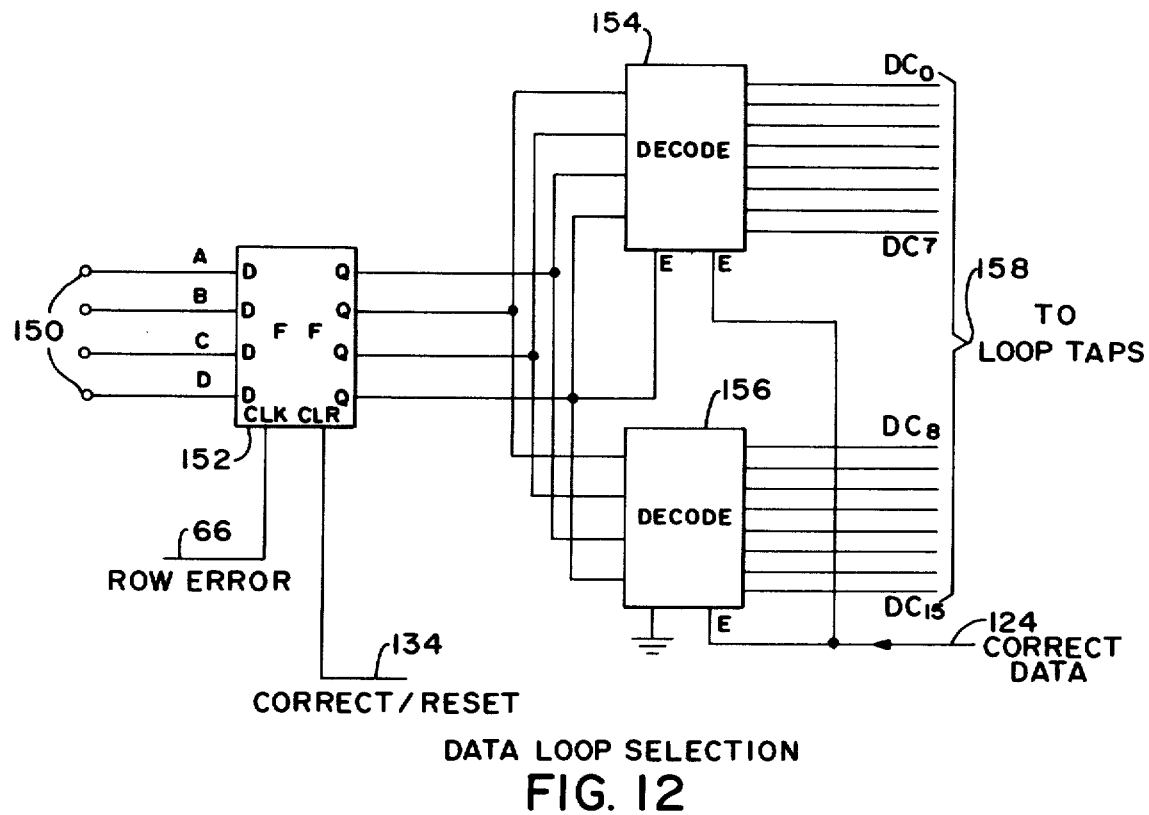
FIG. 12 is a block diagram illustrating the circuit to receive the row error signal, timing signals and correct data signal and provides a loop tap selection signal.
Figure 13:
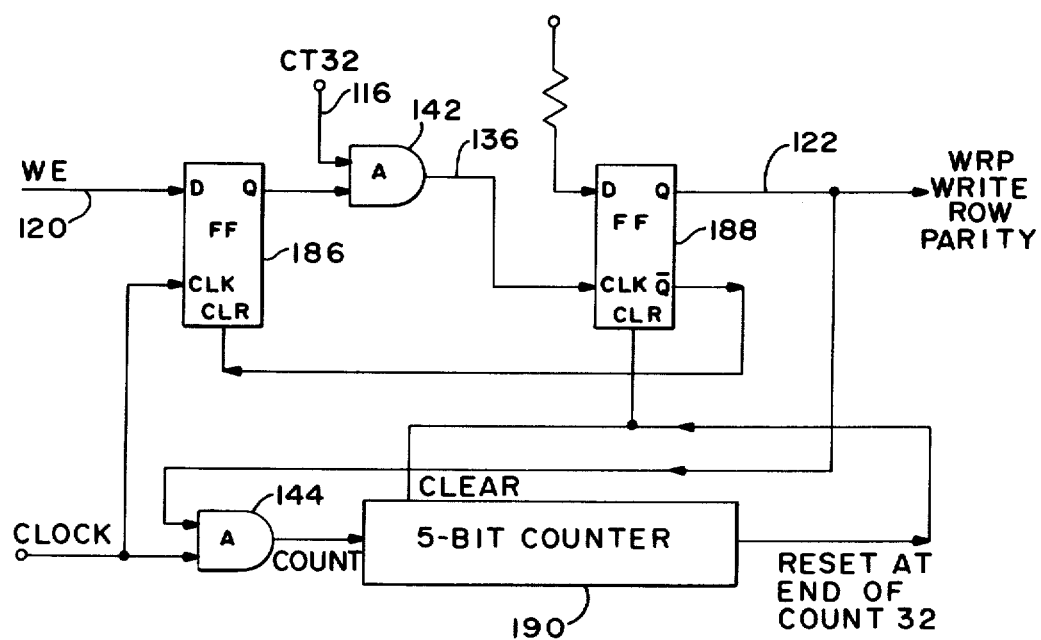
FIG. 13 is a block diagram illustrating the circuit to receive a write enable and chip select signal and generates a write row parity signal when data is entered into memory.

FIGS. 11, 12 and 13 illustrate the circuits of the components in the correction signal generator 54. FIG. 11 is a diagram of the correction timer 86 that detects which type of error occurred: a data error, a column parity error or a row parity error. The timer 86 generates a correct data "CD" signal on conductor 124, a correct row parity CRP signal on conductor 126, or a correct column CCP parity signal on conductor 128, and will generate a 4095 count once any time that a column or row parity error is detected.

A row error signal will set a D-type flip-flop 166 to on, and the Q output entered into the clock input of flip-flop 130 will turn 130 on due to the pull-up at the D input. As flip-flop 130 goes on its $\overline{Q}$ output will clear flip-flop 166. This allows one row error signal to be set in flip-flop 130 and on the row error conductor 131. An identical circuit containing flip-flops 162 and 132 transfers a column error signal on conductor 160 to the column error conductor 133.

A combination of a row error signal on conductor 131 and a column error signal on conductor 133 will cause AND-gate 168 to provide a signal at its output indicating that a data error has occurred and is to be corrected. A combination of "not" a write row parity signal on conductor 136, a data error signal from gate 168, and an output from the 4095 counter 164 will provide a correct data CD output on on conductor 124.

A combination of a row error input and not a column error input to the AND-gate 170 will cause a signal at its output indicating that a row parity error has occurred and is to be corrected. A combination of not a row error input and a column error input to the AND-gate 172 will produce an output signal that a column parity error has occurred and is to be corrected. The row error output from flip-flop 130 and the column error output of the flip-flop 132 are inputs to an OR-gate 174. The output of gate 174 is ANDed together with the clock signal to become the clocking input to a 4095-bit counter 164, the output of which is applied as an input to AND gates 176, 178 and 180.

To determine the location of a bit to be corrected, it is necessary to skip 4095 counts and correct the bit on the 4096th count after the event. The 4095 counter 164 provides this delay and the signal on its output signal is applied to one input of each of the AND-gates 176, 178, and 180 to allow a correction to be activated. A third input is applied to AND-gates 176, 178 and 180 to inhibit any correction when data is being written into the memory and the row parity bits are being stored. This is developed by using the signal on the write row parity conductor 122 as the input to an inverter 138 and using the inverted signal as an input to 176, 178 and 180. When row parity is not being written during data input the signal on conductor 136 will be on to enable the gates 176, 178 and 180. The output from the 4095 counter 164 is also coupled to the input of D-type flip-flop 140 which also receives the clock signal at its clock input. Flip-flop 140 provides a one-cycle delay, and after the 4096th cycle will generate a signal on its Q output conductor 134 to reset flip-flop 130 and flip-flop 132 and to clear the 4095 counter 164.

When parity error occurs in the row parity loop the signal on conductor 126 of FIG. 11 will indicate that a correction is to be made. This signal is used as one input to the OR-gate 182 of FIG. 10. When the output of AND-gate 178 is high, the calculated row parity bit will be substituted for the circulating store parity bit.

The outputs A, B, C, and D of the four-bit counter 110 of FIG. 9 are received by the data loop selection generator on the input terminals 150 as detailed in FIG. 12. As previously explained, the counter 110 divides the system clock frequency to produce output signals having a length of four, eight, sixteen, and thirty-two times the length of a clock cycle. The signals received at the input terminals 150 of FIG. 12 are applied to a four-bit flip-flop 152, the outputs of which are coupled to the input terminals of 3-to-8 line decoders 154 and 156, such as the type 93LS138 decoder. It will be noted that the D-input counter signal to the flip-flop 152, having a length of thirty-two clock cycles, is used to select either the decoder 154 or 156 and that the A, B, and C input counter signals select and "set" the appropriate one of eight output terminals of each decoder 154 and 156. The flip-flop 152 is set by the output signal on conductor 66 of the row error detector 52 so that upon detection of a failed row bit, the flip-flop 152 will store and generate a corresponding output address signal into each of its four output lines so that the appropriately "set" decoder 154 or 156 can direct that signal through the output terminals 158 into the correct one of the sixteen data loop taps in the system such as in FIG. 8.

As previously mentioned, the generation of row parity bits determines a particular data bit group in one of the sixteen data loops containing the failed bit while column parity generation determines the column location of a failed bit which could be in any one of the sixteen data loops. Therefore, an output signal from the column error detector 50 of FIG. 8 is used to further enable and actually trigger the decoders 154 and 156 of FIG. 12 at the precise instant that a failed data bit is available for correction in the circulating data loops. This is accomplished by gating the outputs of decoders 154 and 156 by the signal correct data on conductor 124 generated by the circuits illustrated in FIG. 11. When the signal on a conductor 158 activates the exclusive OR-gate 72 at a loop data tap, FIG. 8, the data bit circulating is inverted to correct it.

The signal on output conductor 128 representing correct column parity, as shown in FIG. 11, is entered as one input to the OR-gate 184 in FIG. 8. When this signal is "on", the calculated column parity for that bit is inserted on the column parity loop 80 instead of the circulating bit stored in that same position. OR-gate 184 is also activated by the write enable signal on conductor 120 so that calculated column parity bit(s) will be stored as data is written into the memory loops.

Figure 14:
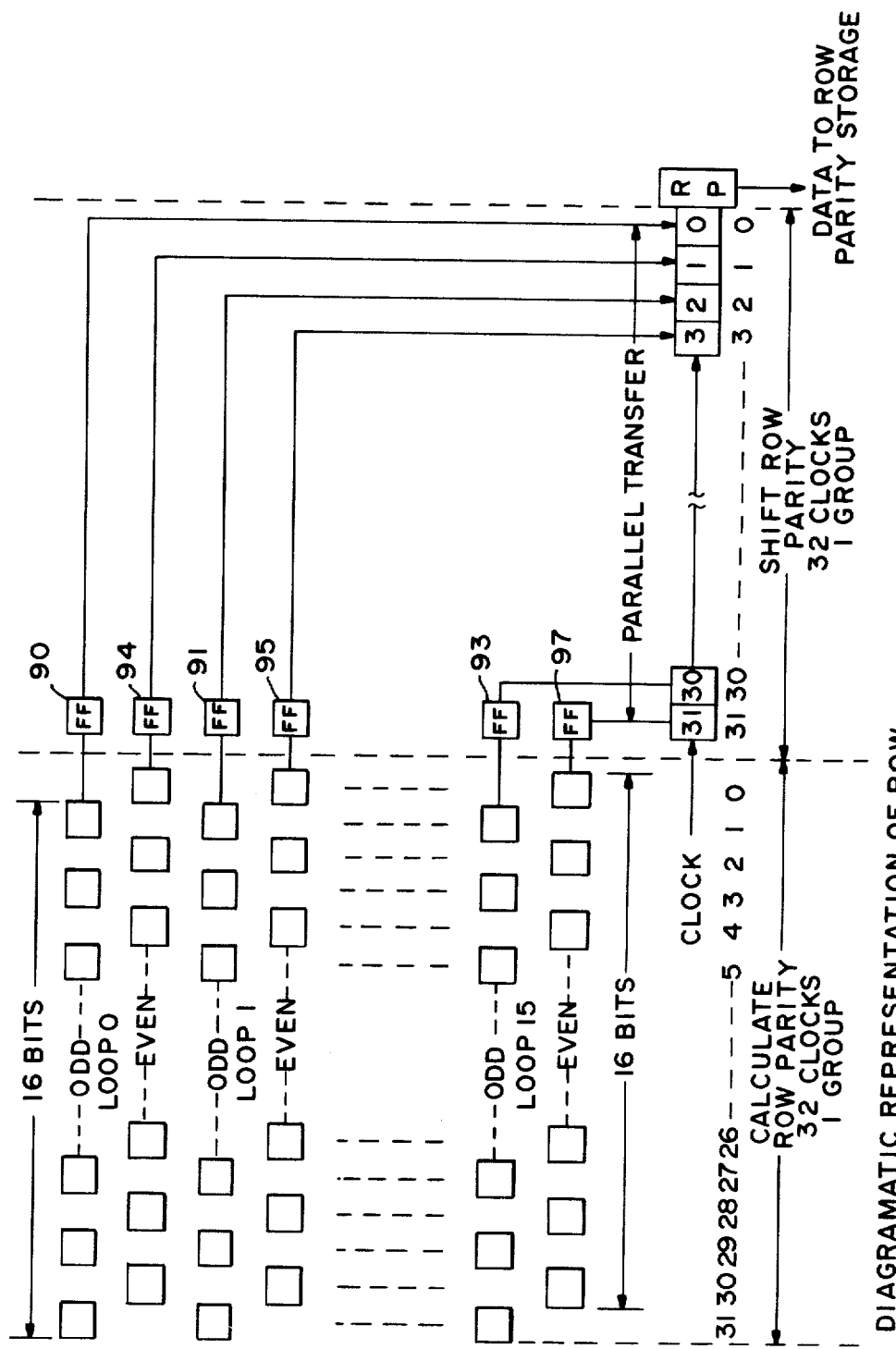
FIG. 14 is a diagrammatic representation of the calculation and storage of row parity bits.

FIG. 14 illustrates the calculation sequence for row parity. Thirty-two bits of a row are divided into two groups: one for the even bits, and one for the odd bits. This is done for all sixteen loops in an identical fashion. The series stream of bits at each loop output is separated and the odd bit outputs are sent to the inputs of "odd" flip-flops 90, 91, 92, 93, of FIG. 9 whose states are changed each time a "one" is sensed. Similarly the even bits are sent to the inputs of second or "even" flip-flops 94, 95, 96, 97 of FIG. 9. At the end of the thirty-two bit sequence, inputting sixteen bits to each flip-flop, the flip-flop outputs are transferred in parallel to the input of the shift register 108 and the flip-flops are reset. The shift register contents are then moved on each subsequent clock cycle and the output becomes the row parity bit sent to the row parity storage loop 48 of FIG. 10. An examination of FIG. 14 will show that row parity for the previous thirty-two bit sequence will be stored during the next thirty-two bit sequence. This means that for a data bit error, column parity will immediately detect an error but the row designation will not be known until some time later. When data is being written into memory it is necessary to calculate row parity as the data enters and then provide circuitry to enter the calculated row parity bits at the proper location as the next thirty-two bit group is entered. Since row parity for all sixteen registers is calculated in parallel the whole row parity group must be stored, even if only one data bit was written. Since column parity is calculated in parallel for all sixteen loops the column parity can be corrected for as few as one or for as many bits as written when data is entered.

The circuits in FIG. 13 provide the necessary timing to correctly write the row parity bits as data is entered into memory. The write enable signal on conductor 120 of FIG. 1 is applied to the D-input of a flip-flop 186 of FIG. 13 and the clock signal is applied to its clock input. When the write enable signal is on, the Q output of flip-flop 186 will enable one input of the AND-gate 142, the other input of which is received from the ripple output conductor 116 of the counter 110 of FIG. 9. The output of gate 142 will be on when the write enable signal is active and when a count of 32 is reached. The output conductor 136 of gate 142 is coupled to the clock input of a flip-flop 188, the D-input of which is coupled to a positive reference and is thus enabled at all times. The Q output conductor 122 of flip-flop 188 is coupled, together with the clock signal conductor to AND-gate 144, the output of which is applied to the five-bit counter 190. At the trailing edge of the 32nd count the output of the five-bit counter 190 will turn off flip-flop 188 and clear the counter. The signal on conductor 122, write row parity, will thus be on for thirty-two cycles. This write row parity signal is connected to the inverter 138 of FIG. 11 to inhibit any other correction while row parity is being entered during a write parity operation. The write row parity signal is also coupled to gate 182 of FIG. 10 to cause the calculated parity bits to be substituted for the stored circulating row parity bits.

Figure 15:
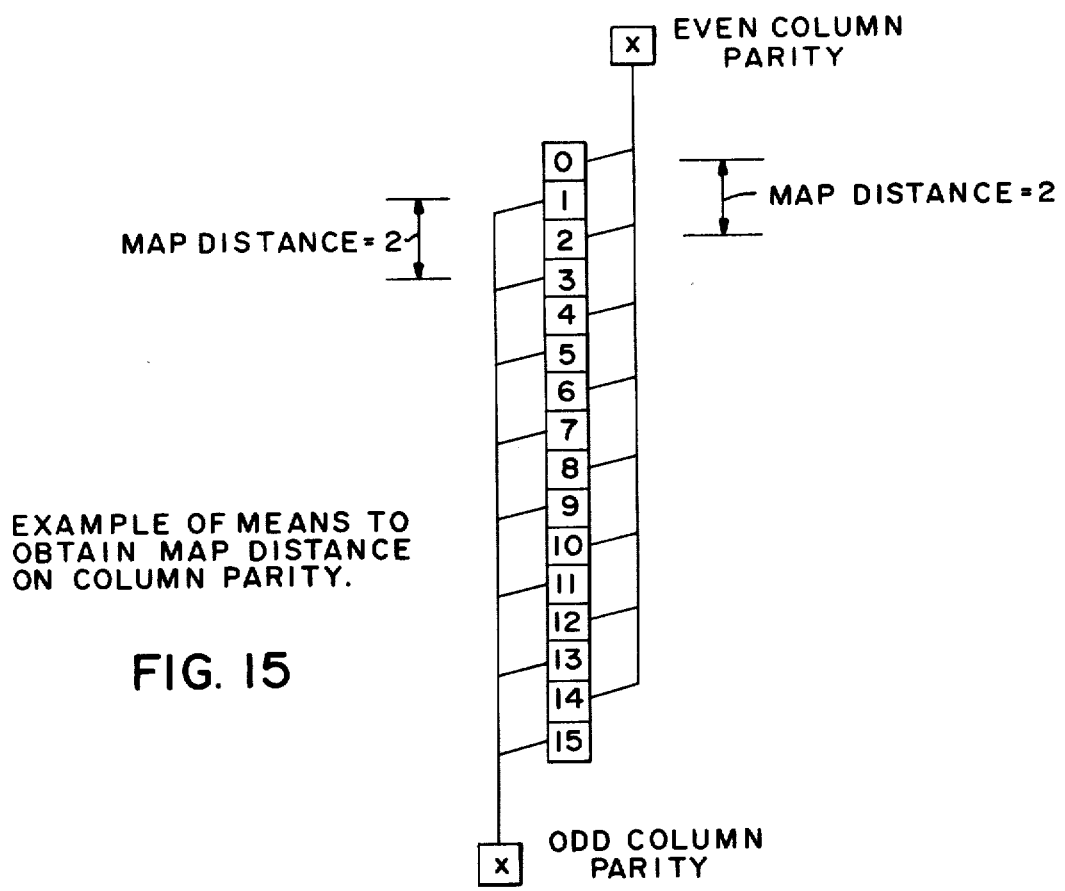
FIG. 15 is a diagram illustrating a technique to provide map distance between column parity bits.

In the embodiment presented herein it was assumed that the sixteen data loops were separated geographically and that a soft failure in one would not also impact another loop. It is possible to design components so that is no longer true, and soft failures may affect adjacent column bits. FIG. 15 illustrates that an odd and even separation of column parity bit calculations will provide a map distance of 2 between adjacent bits by generating an "ODD" column parity and an "EVEN" column parity. This map distance technique may be used to insure proper detection and correction of data bit errors.

Figure 16:
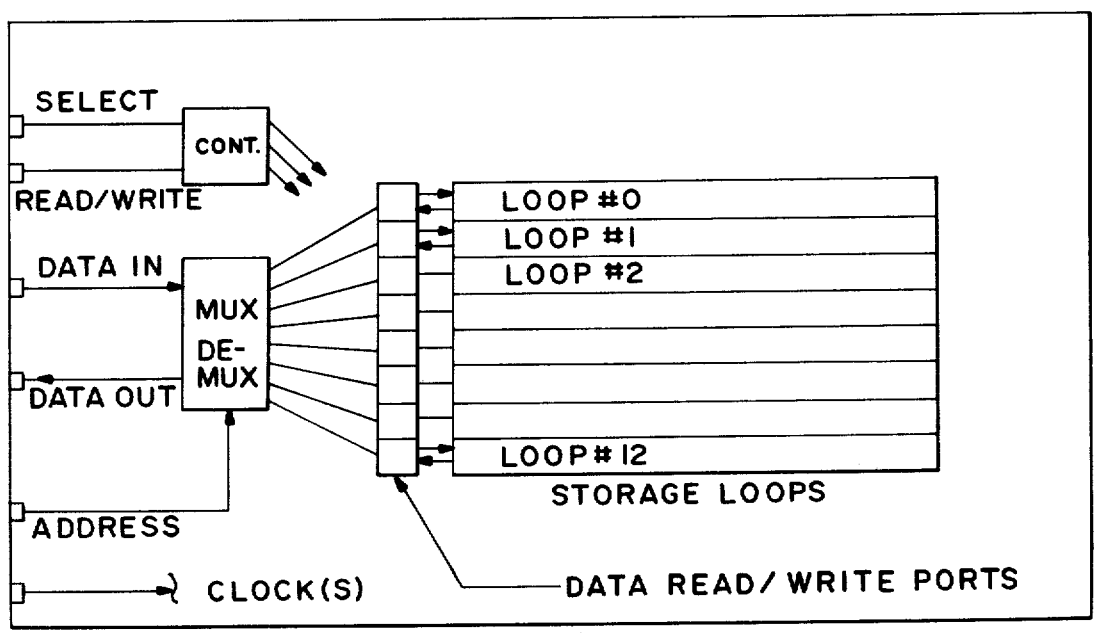
FIG. 16 is a diagram that illustrates a memory component which multiplexes the outputs at a multiplicity of loops.

FIG. 16 illustrates a technique in which the error correction circuitry may not reside on the same substrate with the memory component logic and storage loops. The same technique may be applied when the error detection and correction circuitry is outside of the storage component. FIG. 16 illustrates a storage component consisting of a plurality of thirteen loops each of which circulate data bits that are introduced to input and output terminals through multiplexers (MUX) and demultiplexers (DEMUX). One or more of these loop components may be utilized for each data loop, for the column parity storage loop, and for the row parity storage loop. The type of error detection and correction circuits shown and described as the preferred embodiment may be used external to the components to provide the same error correction system with appropriate adjustments in timing and MUX/DEMUX controls to properly access the storage loops.

What is claimed is:

1. A method for detecting and correcting bit errors in binary data circulating from the output terminal into the input terminal of a first recirculating memory, said method including the steps of:

sampling the data bits circulating from the first memory and storing said bits in a second recirculating memory operating in synchronization with the first memory;

comparing the state of each stored bit circulating from the second memory with the next bit occupying the corresponding location in the first memory as the next corresponding bit circulates from said first memory;

generating an error detection signal whenever the state of said stored bit differs from that of the next corresponding bit;

reversing the state of the next corresponding bit in response to said error detection signal; and inserting said reversed state next corresponding bit into the data circulating from the first memory at the next recirculating bit location of the next corresponding bit.

2. A method for detecting and correcting bit errors randomly introduced into a binary data loop circulating at a system clock frequency from the output terminals into the input terminals of a plurality of substantially identical recirculating memory registers in a memory system, the method comprising the steps of:

sampling the binary data circulating in each of the plurality of data loops at a corresponding plurality of data loop taps;

generating a separate column parity bit from the state of bits in corresponding bit locations in the plurality of data loops as the data bits are sampled at the data loop taps;

sequentially storing the generated column parity bits in a recirculating column parity memory loop operating in synchronization with the plurality of recirculating memory registers;

comparing the state of each of the generated column parity bits circulating through the column parity memory loop with the next corresponding generated parity bit;

producing a column error detection signal whenever the state of the stored parity bit differs from that of the next corresponding generated parity bit, said error detection signal providing means for identifying one column in the plurality of recirculating data loops that contains a bit error;

generating a separate row parity bit calculated from a predetermined group of sequential bits circulating from the output terminal of each of the plurality of recirculating memory registers;

sequentially storing the row parity bits in a recirculating row parity memory loop operating in synchronization with the plurality of recirculating memory registers;

comparing the state of each of the row parity bits circulating through the row parity memory loop with the next corresponding generated row parity bit;

producing a row error detection signal whenever the state of the stored row parity bit differs from that of the next corresponding generated row parity bit, the row error detection signal providing means for identifying the predetermined group of sequential bits in each of the plurality of recirculating memory registers that contain a bit error;

determining, from the occurrence of the row error detection signal and the column error detection signal, the data loop and bit location of the bit error; and correcting the bit error as its location circulates through its respective data loop tap.

3. The method claimed in claim 2 wherein:

the step of generating new parity bits further includes the step of computing a row parity bit for data bits in odd and even membered locations in data bit groups circulating from each of the recirculating memory registers; and each of the row parity bit loop and the column parity bit loop have the same storage capacity as one of the plurality of recirculating memory registers.

4. An error correction system for correcting bit errors randomly introduced into a recirculating memory having a plurality of substantially identical data recirculating registers, each transferring data bits from its output terminal to its input terminal to form a plurality of data memory loops, said error correction system comprising:

a loop data tap in each data memory loop of the plurality of data memory loops, the tap including gating circuitry for conducting data through its respective loop and for stopping the flow of said data to introduce into the loop an externally controlled data bit.

column parity bit generating circuitry coupled to the output of the loop data tap in each of said plurality of data loops for computing parity bits from all data bits in said plurality of loops that are simultaneously moved through their respective data tap;

row parity bit generating circuitry coupled to the output of the tap in each of said plurality of data loops for computing a parity bit from a group of data bits in each of the plurality of data loops as the bits in said group are serially moved through their respective data taps;

parity bit storage circuitry coupled to the column and the row parity generator circuitry for separately storing the column parity bits and the row parity bits in a column parity bit memory and a row parity bit memory, respectively, each of the parity memories having a capacity for storing and recirculating, in synchronization, all of its respectively computed parity bits generated during a circulation of all data stored in the recirculating memory;

column error detection circuitry coupled to the column parity bit generating circuitry and to the column parity bit storage circuitry for comparing each stored parity bit with the next corresponding generated parity bit, both stored and generated parity bits representing data bits occupying the same location in the recirculating memory, the column error detection circuitry producing an error output signal when the next generated parity bit has changed its state from that of its corresponding stored parity bit;

row error detection circuitry coupled to the row parity bit generating circuitry and to the row parity bit storage circuitry for comparing each stored parity bit with the next corresponding generated parity bit, both stored parity bit and corresponding generated parity bit representing data bits occupying the same data bit group and data loop in the recirculating memory, the row error detection circuitry producing an error output signal when said next generated parity bit has changed its state from that of its corresponding stored parity bit; and correction generating circuitry coupled synchronously to the column error detection circuitry and the row error detection circuitry and responsive to the signals therefrom for locating an error location of a faulty data bit producing the changed column and row parity bits, for generating a changed bit output signal to said loop data tap at the time said error location is next to be conducted through said tap, and for correcting the data bit in error.

5. An error correction system for correcting bit errors randomly introduced into a recirculating memory having a plurality of substantially identical data recirculating registers, each transferring data bits from its output terminal to its input terminal to form a plurality of data memory loops, said error correction system comprising:

a loop data tap in each data memory loop of the plurality of data memory loops, the tap including gating circuitry for conducting data through its respective loop and for stopping the flow of said data to introduce into the loop an externally controlled data bit;

column parity bit generating circuitry coupled to the output of the loop data tap in each of said plurality of data loops for computing parity bits from all data bits in said plurality of loops that are simultaneously moved through their respective data tap;

row parity bit generating circuitry coupled to the output of the tap in each of said plurality of data loops for computing a parity bit from a group of data bits in each of the plurality of data loops as the bits in said group are serially moved through their respective data taps;

parity bit storage circuitry coupled to the column and the row parity generator circuitry for separately storing the column parity bits and the row parity bits in a column parity bit memory and a row parity bit memory, respectively, each of the parity memories having a capacity for storing and recirculating, in synchronization, all of its respectively computed parity bits generated during a circulation of all data stored in the recirculating memory;

column error detection circuitry coupled to the column parity bit generating circuitry and to the column parity bit storage circuitry for comparing each stored parity bit with the next corresponding generated parity bit, both stored and generated parity bits representing data bits occupying the same location in the recirculating memory, the column error detection circuitry producing an error output signal when the next generated parity bit has changed its state from that of its corresponding stored parity bit;

row error detection circuitry coupled to the row parity bit generating circuitry and to the row parity bit storage circuitry for comparing each stored parity bit with the next corresponding generated parity bit, both stored parity bit and corresponding generated parity bit representing data bits occupying the same data bit group and data loop in the recirculating memory, the row error detection circuitry producing an error output signal when said next generated parity bit has changed its state from that of its corresponding stored parity bit; and correction generating circuitry coupled synchronously to the column error detection circuitry and the row error detection circuitry and responsive to the signals therefrom for locating an error location of a faulty column parity bit producing the changed column parity bit, for generating a changed bit output signal to said column parity bit memory at the time said error location is next to be conducted through said tap, and for correcting the column parity bit in error.

6. An error correction system for correcting bit errors randomly introduced into a recirculating memory having a plurality of substantially identical data recirculating registers, each transferring data bits from its output terminal to its input terminal to form a plurality of data memory loops, said error correction system comprising:

a loop data tap in each data memory loop of the plurality of data memory loops, the tap including gating circuitry for conducting data through its respective loop and for stopping the flow of said data to introduce into the loop an externally controlled data bit;

column parity bit generating circuitry coupled to the output of the loop data tap in each of said plurality of data loops for computing parity bits from all data bits in said plurality of loops that are simultaneously moved through their respective data tap;

row parity bit generating circuitry coupled to the output of the tap in each of said plurality of data loops for computing a parity bit from a group of data bits in each of the plurality of data loops as the bits in said group are serially moved through their respective data taps;

parity bit storage circuitry coupled to the column and the row parity generator circuitry for separately storing the column parity bits and the row parity bits in a column parity bit memory and a row parity bit memory, respectively, each of the parity memories having a capacity for storing and recirculating, in synchronization, all of its respectively computed parity bits generated during a circulation of all data stored in the recirculating memory;

column error detection circuitry coupled to the column parity bit generating circuitry and to the column parity bit storage circuitry for comparing each stored parity bit with the next corresponding generated parity bit, both stored and generated parity bits representing data bits occupying the same location in the recirculating memory, the column error detection circuitry producing an error output signal when the next generated parity bit has changed its state from that of its corresponding stored parity bit;

row error detection circuitry coupled to the row parity bit generating circuitry and to the row parity bit storage circuitry for comparing each stored parity bit with the next corresponding generated parity bit, both stored parity bit and corresponding generated parity bit representing data bits occupying the same data bit group and data loop in the recirculating memory, the row error detection circuitry producing an error output signal when said next generated parity bit has changed its state from that of its corresponding stored parity bit; and correction generating circuitry coupled synchronously to the column error detection circuitry and the row error detection circuitry and responsive to the signals therefrom for locating an error location of a faulty row parity bit producing the changed row parity bit, for generating a changed bit output signal to said row parity bit memory at the time said error location is next to be conducted through said tap, and for correcting the row parity bit in error.

7. The correction system claimed in claim 4, 5 or 6 wherein each of the plurality of data recirculating registers in said recirculating memory has an interlaced serial-parallel-serial organization, and wherein the data bits in the serial output register are sequentially reorganized.

8. The error correction system claimed in claim 7 wherein said correction generating system includes means for locating the column having a faulty column parity bit and for generating a correct column parity bit signal to the proper bit location in said column parity bit storage circuitry.

9. The error correction system claimed in claim 7 wherein said correction generating system includes circuitry means for locating a serial bit group having a faulty row parity bit and for generating a correct row parity bit signal to the proper location in said row parity bit storage circuitry.

10. The error correction system claimed in claim 7 wherein said correction generating system includes circuitry means for locating the column location having a faulty column parity bit and the bit group having a faulty row parity bit, and further includes timing and loop selection circuitry for transferring said changed bit output signal, at the appropriate instant, to the loop data tap associated with the data memory loop containing the faulty data bit.

11. The correction system claimed in claim 7 wherein the correction generating circuitry includes addressing circuitry for sequentially addressing each of the plurality of data memory loops in said recirculating memory, the addressing circuitry being enabled by the occurrences of an error output signal from the row error detection circuitry.

12. The correction system claimed in claim 11 wherein the correction generating circuitry further includes counting circuitry, the counting of which is initiated by the occurrence of an error output signal from said column error detection circuitry, the counting circuitry generating a change bit enabling signal to said addressing circuitry at the moment for next arrival at the respective loop tap of the faulty bit that produced the row and column parity bit error output signals.

13. The correction system claimed in claim 7 wherein the row parity bit generating circuitry includes first and second input flip-flops enabled by the state of the data bit at each of the plurality of loop data taps, the first and second flip-flops being activated by alternate common cycles, the row parity bit generating circuitry further including a parallel-input serial-output shift register, first and second parallel input terminal pairs of which are coupled to each of the first and second input flip-flops, respectively.

14. The correction system claimed in claim 13 wherein the first and second input flip-flops in the row parity bit generating circuitry are enabled by data bits in odd and even bit locations emanating from the recirculating register serial output register.

15. The correction system claimed in claim 7 wherein the recirculating memory is dynamic and includes a plurality of sixteen data recirculating registers, wherein the row parity bit generator includes sixteen pairs of odd-even input flip-flops, each cleared every 32 counts of a common clock, and a 32-bit parallel input serial output shift register having its output clocked every 32 clock counts.

16. The correction system claimed in claim 12 wherein each of the memory loops has 4096 circulating data storage locations and wherein the correction generating circuitry clock counting circuitry generates the change bit enabling signal 4095 clock counts after being enabled by the occurrence of a column error output signal.

* * * * *